(12) United States Patent
Womac

(10) Patent No.: US 6,580,313 B1
(45) Date of Patent: Jun. 17, 2003

(54) SYSTEM AND METHOD FOR PROVIDING SINGLE PIN BYPASS FOR MULTIPLE CIRCUITS

(75) Inventor: Michael D. Womac, McKinney, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 10/138,356

(22) Filed: May 3, 2002

(51) Int. Cl.[7] ................................................. H03B 1/00
(52) U.S. Cl. ......................... 327/551; 327/415; 327/534
(58) Field of Search ................................. 327/415, 416, 327/417, 530, 534, 535, 538, 543, 551

(56) References Cited

U.S. PATENT DOCUMENTS

2002/0008585 A1 * 1/2002 Welland ........................ 331/2

* cited by examiner

Primary Examiner—Jeffrey Zweizig
(74) Attorney, Agent, or Firm—Fulbright & Jaworski LLP

(57) ABSTRACT

Disclosed are systems and methods which provide a common bypass node with respect to multiple circuits of an integrated circuit. According to a preferred embodiment, a circuit for filtering bias noise introduced by components of the integrated circuit may be coupled to this common bypass node and bypass bias filtering may be provided with respect to each of the multiple circuits. According to a preferred embodiment, the common bypass node is associated with an external lead or pin of the integrated circuit to thereby facilitate the efficient use of integrated substrate area as well as the efficient use of external interfaces thereof. Additionally, the common bypass node of the preferred embodiment may be utilized in providing cooperative operation of the multiple circuits coupled thereto.

52 Claims, 1 Drawing Sheet

SYSTEM AND METHOD FOR PROVIDING SINGLE PIN BYPASS FOR MULTIPLE CIRCUITS

BACKGROUND OF THE INVENTION

Many integrated circuits today are fabricated using complementary metal-oxide silicon (CMOS) processes. For example, semiconductor fabrication facilities (fabs) for producing CMOS monolithic circuits are relatively common, particularly for use in foundry arrangements where a "fabless" developer wishes to have their circuit designs created in an integrated circuit. Moreover, CMOS processes are relatively inexpensive and typically produce a high yield as compared to some other integrated circuit fabrication processes.

CMOS devices which are available using common CMOS processes include N-type (NMOS) and P-type (PMOS) devices. PMOS devices may be preferred for use in providing switchable selection of circuits, such as under control of a digital controller, due to their resistance to premature switching as compared to NMOS devices. Moreover, PMOS devices may be desirable for use in providing a controlled current source due to their reduced resistance as compared to an NMOS device of similar size and configuration.

In addition to the above mentioned device types, bipolar devices may also be available when using a bi-CMOS process. Such bipolar devices typically include NPN-type devices and PNP-type devices. Bipolar devices generally exhibit superior noise performance as compared to the aforementioned PMOS devices and even NMOS devises. Bipolar devices are often desirable for use in resonators or voltage controlled oscillators due to the need for good noise performance.

The use of CMOS processes to provide electronic components is not, however, without disadvantage. For example, PMOS devices are often noisy, particularly in the low frequency ranges, such as in the range from approximately 100 Hz to approximately 1 MHz. Accordingly, a circuit implementing a PMOS device, such as to provide a current source, may experience the introduction of noise associated with the PMOS device. Although bipolar devices have much superior noise performance than do PMOS devices, the lateral PNP bipolar devices (which are typically available in most BiCMOS technologies) may not provide a suitable current source, e.g., the efficiency and/or the size of the device may not meet design preferences. Moreover, it is often difficult to provide an acceptable match between a PMOS device and a bipolar devices in particular circuit configurations, or portions thereof, thereby suggesting the use of a PMOS device in some situations.

Accordingly, integrated circuits may be developed utilizing PMOS devices, for which noise filtering is desired. For example, a voltage controlled oscillator circuit may be developed in an integrated circuit using CMOS processes in which a PMOS transistor is utilized in providing a current source. A circuit providing bypass filtering of the bias noise associated with the use of a PMOS transistor current source may include an inductor and capacitor (LC) filter network. A capacitor utilized in such a filtering circuit may be relatively large, such as on the order of 1 $\mu F$. However, substrate space in such integrated circuits is typically limited and, therefore, must be utilized efficiently. Accordingly, it may be desirable to utilize a discrete capacitor and/or other filter circuit components, in order to efficiently utilize substrate area.

However, a competing concern is the availability of external leads (pins) from an integrated circuit package. For example, as large scale integration is utilized in providing an integrated circuit, the physical size of the integrated circuit, and therefore its packaging, becomes smaller while the number of signals provided thereto/therefrom increases. Accordingly, efficient use should be made of integrated circuit external leads.

Accordingly, a need exists in the art for systems and methods which provide for efficient filtering of noise associated with the use of particular components in an integrated circuit.

A further need exists in the art for such systems and methods to provide optimized use of integrated circuit external leads.

BRIEF SUMMARY OF THE INVENTION

The present invention is directed to systems and methods which provide a common bypass node with respect to multiple circuits of an integrated circuit. According to a preferred embodiment, a circuit for filtering bias noise introduced by components of the integrated circuit may be coupled to this common bypass node and bypass bias filtering may be provided with respect to each of the multiple circuits. According to a preferred embodiment, the common bypass node is associated with an external lead or pin of the integrated circuit to thereby facilitate the efficient use of integrated substrate area as well as the efficient use of external interfaces thereof.

For example, according to a most preferred embodiment of the present invention, an integrated circuit provides multiple voltage controlled oscillators (VCOs), such as to provide a wide range of oscillator frequencies through use of a series of oscillators each providing controlled oscillation in a portion of the wide range of oscillator frequencies. Bias current to the multiple VCOs is preferably provided through a node common to each VCO circuit. For example, a common current source may be provided with respect to the multiple VCOs, whereby switching circuitry may be utilized in selecting one or more VCOs to which current from the current source is to be provided at any particular point in time. The common node is preferably utilized for coupling a bypass filter circuit to thereby provide bypass bias noise filtering with respect to each VCO.

A most preferred embodiment bypass filter circuit comprises a LC filter network. A capacitor utilized in such a LC filter network is expected to be relatively large, such as on the order of 1 $\mu F$, and therefore is preferably implemented external to the preferred embodiment integrated circuit. For example, a discrete capacitor may be coupled to an external lead or pin of the aforementioned integrated circuit to thereby provide an inexpensive solution which optimizes the use of integrated circuit substrate area. Moreover, as the preferred embodiment utilizes a common node for each VCO, the use external interfaces in providing bypass bias noise filtering is minimized.

Additionally, the common bypass node of the preferred embodiment may be utilized in providing cooperative operation of the multiple circuits coupled thereto. For example, where the aforementioned single current source is used to provide bias current multiple VCOs, the common node coupling may be utilized in splitting the current for simultaneous operation of multiple VCOs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
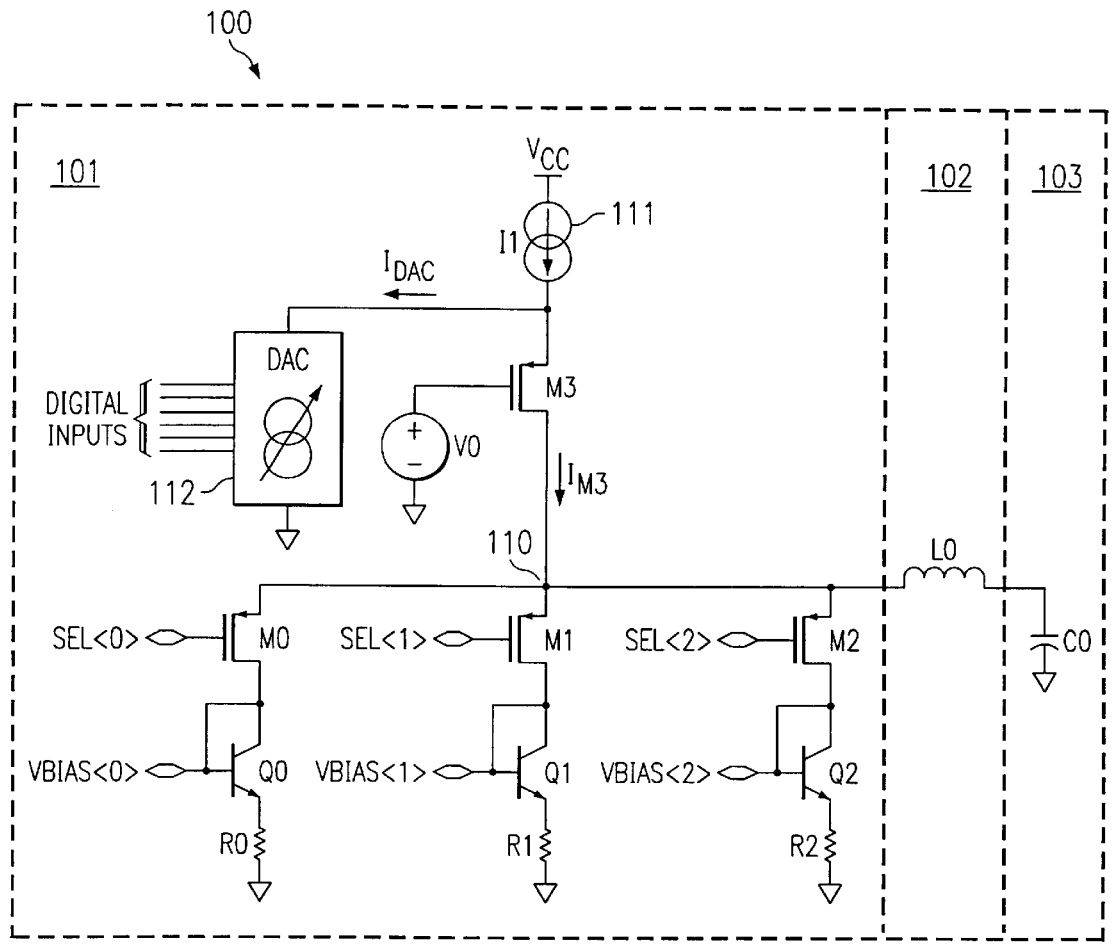
FIG. 1 shows a circuit implementing a preferred embodiment of the present invention.

Directing attention to FIG. 1, a high level circuit diagram in which an embodiment of the present invention is implemented is shown. The circuits of FIG. 1 are provided herein to aid in the understanding of the concepts of the present invention and are not intended to limit the scope thereof. Accordingly, it should be appreciated that the present invention is not limited to use with respect to the particular circuits or components shown in FIG. 1.

FIG. 1 shows circuit 100 in which 3 voltage controlled oscillators (VCOs) are selectable so as to provide controlled oscillation throughout a wide range of oscillator frequencies. Specifically, a first VCO bias/selection circuit is defined by bi-polar transistor Q0 and resistor R0, a second VCO bias/selection circuit is defined by bi-polar transistor Q1 and resistor R1, and a third VCO bias/selection circuit is defined by bi-polar transistor Q2 and resistor R2. Control voltages are provided to each VCO bias/selection circuit as sel(0), sel(1), and sel(2) for selecting operation of a corresponding VCO. Vbias(0), Vbias(1), Vbias(2) are the bias voltages of the corresponding VCOs.

According to the illustrated embodiment, each of the 3 VCO bias/selection circuits, as well as other components of circuit 100, are disposed upon integrated circuit substrate 101, such as may comprise silicon or any other monolithic circuit substrate. Accordingly, the multiple VCOs of circuit 100 may be provided in an integrated circuit package.

It should be appreciated that operation of an ideal VCO provides an output signal which is a pure tone of a particular frequency corresponding to the tune voltage. That is, viewed in the frequency domain, the output of an ideal VCO should be an impulse signal. For example, when an ideal VCO is provided with a tune voltage to provide a 1 GHz output, all the VCO energy should appear at 1 GHz, without any energy bleeding into other frequencies, such as 1.001 GHz.

Noise energy present in the VCO circuit, such as may be associated with a bias current applied thereto, will tend to spread the output signal out across multiple frequencies. For example, the use of P-type MOS (PMOS) devices with the aforementioned VCOs may result in a smearing of the output signal of the VCO. Specifically, PMOS devices typically have a poor noise characteristic, particularly in the low frequency range from 100 Hz to 1 MHz. The noise characteristics of these devices tend to roll off and are inversely proportional to frequency. So as frequency goes down, noise goes up, which is not a desirable characteristic for use in a VCO.

However, it may be desirable to utilize a PMOS device in a current source for particular design reasons despite the noise characteristics thereof. For example, a PMOS transistor may be utilized in a VCO bias current source in order to provide a suitable match with respect to other components of the circuit, because such a PMOS device may be configured to provide an efficient current source with a relatively small footprint, etcetera.

Accordingly, filtering may be implemented with respect to each such VCO for which noise energy is a problem. For example, a capacitor and a resistor (RC), and/or inductor and capacitor (LC) filter network may be utilized with respect to each VCO to provide desired filtering of a bias current input thereto. However, the value of capacitors utilized in such an endeavor may be relatively large, such as on the order of 1 $\mu$F. Implementing such large capacitors in an integrated circuit substrate, such as upon substrate 101 with the VCOs and other components of circuit 100, may not be desirable due to the limited amount of area available and/or the availability and price of discrete capacitors.

Accordingly, components of a filter and/or filter network, such as the aforementioned capacitors, are preferably disposed off of integrated circuit substrate 101, i.e., "off chip." However, it is desirable to minimize the use of connections providing external interfacing with respect to an integrated circuit because integrated circuit packages are typically limited in the number of such interfaces or "pins" available.

A preferred embodiment of the present invention optimizes the use of filtering circuits, as well as components and interfaces used thereby, by configuring the circuit to allow a single filter circuit to provide desired filtering with respect to multiple portions of the circuit. Accordingly, the 3 VCO bias/selection circuits of circuit 100 are each coupled at the source of their respective transistors Q0–Q2 to provide common node 110. This particular point was chosen as a common node according to the present invention because it provides a low impedance point at which a capacitor may be placed to provide a noise filter to bypass the noise from the circuits of interest. Accordingly, utilizing common node 110 of the present invention, a single bypass bias noise filter may be implemented with respect to all multiple circuit portions, such as the 3 VCOs corresponding to the VCO bias/selection circuits of circuit 100.

Referring still to FIG. 1, capacitor C0 of the preferred embodiment shared bypass bias noise filter is disposed "off chip" on printed circuit board 103. Because the preferred embodiment filter circuit is shared among all 3 VCO bias/selection circuits, only a single integrated circuit package external interface (pin) is utilized. Of course, other filter configurations, such as LC filter networks, RC filter networks, and/or multiple stage filter networks, may be utilized according to the present invention, if desired. Moreover, there is no limitation that a common node of the present invention be utilized for providing filtering.

Having provided a common point for bypass bias noise filtering according to the present invention, further circuit simplification may be accomplished according to the present invention. For example, a same current source may be used for providing a bias current to each of the 3 VCO bias/selection circuits, and the corresponding VCOs, by coupling a current source to the common node.

Figure 2:
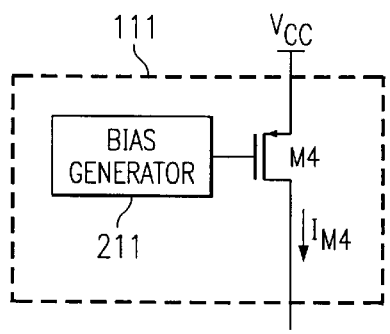
FIG. 2 shows additional detail with respect to a portion of the circuit of FIG. 1.

In the illustrated embodiment, bias current is provided for each VCO in circuit 100 by current source 111. A preferred embodiment of current source 111 is shown with more detail in FIG. 2. As shown in FIG. 2, current source 111 may comprise P-type metal-oxide silicon field effect transistor (PMOSFET or PMOS) transistor M4 coupled to bias generator 211 to provide a controlled bias current to the VCOs of circuit 100. This preferred embodiment current source configuration provides a constant current, $I_{M4}$, although other configurations may be utilized according to the present invention.

It should be appreciated that, PMOS transistor M4 may have a relatively poor noise figure, and therefore $I_{M4}$ may be relatively noisy. However, the bypass bias noise filter configuration of the preferred embodiment provides an efficient and relatively small footprint technique for filtering the bias current for all the VCOs of circuit 100.

According to the illustrated embodiment, bias current is switchably provided to one or more of the VCOs using a corresponding one of switching PMOS transistors M0, M1, and M2. PMOS transistors M0, M1, and M2 are preferably configured to provide digitally selectable switches which route bias current to the appropriate circuit based on digital control signals provided to each of M0, M1, and M2 as Sel(0), Sel(1), and Sel(2) respectively. For example, a voltage of zero volts provided as Sel(X) to one of the switching PMOS transistors M0–M2 will route the current from current source 111 to a portion of circuit 100 corresponding thereto, here an associated one of the three VCOs defined by bipolar transistors Q0–Q2. Accordingly, digital control signals may be utilized to select a particular VCO to provide an output tone at any particular time, such as a VCO providing a desired frequency response range within a wider band of frequencies covered by the combination of VCOs. Thereafter, a corresponding tune voltage, Vtune (X) (not shown), may be controlled to provide a desired tone within the selected VCO's frequency response range.

The present invention is not limited to the selection of only one circuit portion coupled to the common node for operation at a time. For example, provided sufficient current is available from current source 111, any or all of the VCO bias/selection circuits of circuit 100, and thus their corresponding VCOs, may be activated, by providing the appropriate control signal to corresponding ones of switching PMOS transistors M0, M1, and M2. In such an embodiment, the current $I_{M3}$ provided to any selected one of the VCOs would be substantially dependent upon the impedance of the selected circuit portions, e.g., transistors Q0–Q2 and resistors R0–R1. Accordingly, these components may be designed/manipulated to result in any ratio of current splitting desired. The attributes of PMOS switching transistors M0, M1, and M2 are substantially irrelevant with respect to the splitting of the current, provided these transistors are large enough to handle the current to be passed thereby.

It should be appreciated that the use of the preferred embodiment common node may be further leveraged in providing simplified circuitry and/or circuit features. For example, referring again to FIG. 1, controllable current sink 112 is shown coupled to the output of current source 111 to thereby provide control with respect to the bias current provided to each of the VCO circuits of circuit 100. Such a controllable current sink may be utilized to control the amplitude of the tone provided by a selected one of the VCOs. Additionally or alternatively, controllable current sink 112 may be utilized to adjust the current provided to the VCOs as a function of the number thereof selected for operation at any particular point in time.

Controllable current sink 112 may be comprised of a digital to analog converter circuit accepting digital control signals for selecting an amount of current, in the preferred embodiment from 0 to $I_{M4}$, to thereby control the amount of the current output from current source 111 made available to any of the VCO bias/selection circuits of circuit 100, i.e., $I_{M3}=I_{M4}-I_{DAC}$. The resolution of the incremental current sunk by current sink 112 ($I_{DAC}$) in such an embodiment would be determined by the bit depth of the digital control signals.

Irrespective of the particular use to which controllable current sink 112 is put, it should be appreciated that only a single such device need be implemented according to the present invention in order to provide controlled current adjustment to multiple portions of circuit 100. Accordingly, circuit 100 is enabled to provide robust features and functions while minimizing the use of complex circuitry and components.

Although it is possible to couple controllable current sink 112 directly to common node 110, the illustrated embodiment provides PMOS transistor M3 disposed therebetween. PMOS transistor M3 of the preferred embodiment provides a buffer. Vcc provided to the source of current source PMOS transistor M4 is on the order of 6 V, e.g., 5 V<Vcc<6 V, according to a preferred embodiment. This preferred embodiment current source configuration provides a constant current, $I_{M4}$, of approximately 6 mA, although other configurations may be utilized according to the present invention. However, many CMOS components, such as fine line technologies of ½ micron or ¼ micron as may be implemented with respect to PMOS transistors M0–M2, may begin to breakdown at voltages over approximately 3 V. Accordingly, the illustrated embodiment disposes PMOS transistor M3 between Vcc and PMOS transistors M0–M2 in order to isolate these devices from the voltage of Vcc.

For example, according to a preferred embodiment, bias voltage Vdc provided to M3 may be in the mid range of Vcc, e.g., approximately 3 V. Accordingly, PMOS transistor M3 may substantially divide the voltage Vcc as seen by circuitry coupled to common node 110, while allowing substantially all current provided by current source 111 to pass. According to the illustrated embodiment, PMOS transistor M3 provides both a point at which current sink 112, a digital to analog converter in the preferred embodiment, may be disposed to manipulate the VCO bias current, as well as providing voltage buffering.

From the above, it should be appreciated that a synergism exists as a result of the preferred embodiment common node bypass bias noise filter configuration. Accordingly, implementation of the preferred embodiment facilitates further circuit improvement, such as in the form of implementing further features/functionality with a minimum of complexity and/or components.

Although preferred embodiments of the present invention have been described herein with reference to CMOS, PMOS, and bipolar devices, it should be appreciated that there is no limitation to the present invention being utilized therewith. Likewise, although a preferred embodiment circuit comprising VCOs has been described, embodiments of the present invention may be utilized with respect to other circuitry, such as amplifiers, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit system comprising:
    a plurality of independently operable circuit portions, wherein each said circuit portion is disposed upon a same integrated circuit substrate;
    a shared circuit portion disposed upon said integrated circuit substrate;
    a common node coupling each said circuit portion, wherein said common node is disposed in said integrated circuit substrate between said plurality of circuit portions and said shared circuit portion; and
    an external interface coupled to said common node, wherein said external interface and said common node are configured to provide a single point of signal manipulation for use with respect to each said circuit portion.

2. The system of claim 1, wherein said plurality of independently operable circuit portions each comprise a voltage controlled oscillator.

3. The system of claim 2, wherein said plurality of voltage controlled oscillators comprise voltage controlled oscillators having a different frequency range such that said plurality provides a usable frequency range larger than any individual said voltage controlled oscillator.

4. The system of claim 2, wherein said voltage controlled oscillators each comprise a bipolar transistor.

5. The system of claim 2, wherein said shared circuit portion comprises a current source.

6. The system of claim 5, further comprising:
    a current sink in communication with said current source and operable to control an amount of current provided to one or more of said voltage controlled oscillators.

7. The system of claim 6, wherein said current sink is digitally controlled.

8. The system of claim 6, wherein said current sink comprises a digital to analog converter.

9. The system of claim 6, wherein said current sink controls said amount of current as a function of a number of active said voltage controlled oscillators.

10. The system of claim 6, wherein said current sink controls said amount of current as a function of an desired operating attribute of an active said voltage controlled oscillator.

11. The system of claim 2, wherein said shared circuit portion comprises an active circuit component having a relatively poor noise response.

12. The system of claim 11, wherein said relatively poor noise response is associated with frequencies including approximately 100 Hz to approximately 1 MHz.

13. The system of claim 11, wherein said shared circuit portion comprises a PMOS transistor.

14. The system of claim 11, wherein said external interface provides a noise bypass filter node.

15. The system of claim 14, further comprising a filter capacitor coupled to said external interface.

16. The system of claim 15, wherein said filter capacitor is approximately 1 micro-Farad.

17. The system of claim 15, wherein said filter capacitor is a discrete circuit component.

18. The system of claim 14, wherein said filter capacitor is part of an inductor and capacitor filter network.

19. The system of claim 18, wherein an inductor of said inductor and capacitor filter network is provided by a bond wire of an integrated circuit package associated with said integrated circuit substrate.

20. The system of claim 1, further comprising:
    a plurality of controllable switching components, wherein a controllable switching component of said plurality is disposed in each circuit portion of said plurality of circuit portions.

21. The system of claim 20, wherein said controllable switching components are digitally controllable.

22. The system of claim 21, wherein said controllable switching components comprise PMOS transistors.

23. The system of claim 20, wherein said controllable switching components are operable to select a circuit portion of said plurality for activation.

24. The system of claim 23, wherein said controllable switching components are operable to select a plurality of circuit portions of said plurality for activation at a particular point in time.

25. The system of claim 1, further comprising:
    a buffer disposed between said shared circuit portion and said common node.

26. The system of claim 25, wherein said buffer provides isolation of a voltage utilized by said shared circuit portion from said plurality of circuit portions.

27. A method of providing filtering with respect to a plurality of oscillator circuits, said method comprising:
    providing a current source to be used with said plurality of oscillator circuits, wherein said current source has an undesirable noise performance with respect to said plurality of oscillator circuits;
    coupling each said oscillator circuit to said current source using a common node; and
    coupling a filter circuit to said common node to provide bypass bias noise filtering with respect to each oscillator circuit of said plurality.

28. The method of claim 27, wherein each said oscillator circuit of said plurality and said common node are disposed upon a same integrated circuit substrate.

29. The method of claim 28, wherein said current source is disposed upon said integrated circuit substrate.

30. The method of claim 28, wherein at least a portion of said filter circuit is disposed off of said integrated circuit substrate.

31. The method of claim 30, wherein said filter circuit utilizes a single external interface provided from said integrated circuit substrate, said single external interface being coupled to said common node.

32. The method of claim 30, wherein said at least a portion of said filter circuit disposed off of said integrated circuit substrate comprises a capacitor.

33. The method of claim 30, wherein said filter circuit comprises a filter network.

34. The method of claim 27, wherein said oscillator circuits of said plurality comprise a switchable connection to said common node to thereby allow controlling communication between oscillator circuits and said current source.

35. The method of claim 34, further comprising:
controlling said switchable connections to place a single oscillator circuit of said plurality in communication with said current source at a particular point in time.

36. The method of claim 34, further comprising:
controlling said switchable connections to place at least two oscillator circuits of said plurality in communication with said current source at a particular point in time.

37. The method of claim 34, wherein said switchable connections comprise switching transistors.

38. The method of claim 37, wherein said switching transistors comprise PMOS devices, and wherein said current source comprises a PMOS transistor.

39. The method of claim 38, further comprising:
providing a buffer coupled between said current source and said plurality of oscillator circuits.

40. The method of claim 39, wherein said current source is provided a voltage greater than the breakdown voltage of said switching transistors, and wherein said buffer provides voltage buffering with respect to said switching transistors.

41. The method of claim 27, further comprising:
providing a current sink coupled to said current source, wherein said current sink is controllable to select a current provided to oscillator circuits of said plurality.

42. The method of claim 41, wherein said current sink is digitally controlled.

43. The method of claim 41, wherein said current sink comprises a digital to analog converter.

44. An oscillator circuit system comprising:
a plurality of independently controllable oscillators;
a plurality of switching circuits, wherein at least one switching circuit is coupled to each oscillator of said plurality;
a common node coupling each said switching circuit;
a bias circuit coupled to said common node to provide a bias signal for use with each said oscillator of said plurality; and
a bias signal manipulation circuit coupled to said common node to provide bias signal manipulation with respect to each oscillator of said plurality.

45. The system of claim 44, wherein said bias circuit has an undesirable noise performance with respect to said plurality of oscillator circuits, and wherein said bias signal manipulation circuit provides filtering of noise from said bias signal.

46. The system of claim 45, wherein said bias signal manipulation circuit comprises a discrete capacitor coupled to said common node.

47. The system of claim 46, wherein said plurality of independently controllable oscillators are disposed upon an integrated circuit.

48. The system of claim 47, wherein said plurality of switching circuits, said common node, and said bias circuit are disposed upon said integrated circuit.

49. The system of claim 45, wherein said bias circuit comprises a current source.

50. The system of claim 49, wherein said current source comprises a PMOS transistor.

51. The system of claim 44, wherein said independently controllable oscillators comprise voltage controlled oscillators.

52. The system of claim 44, wherein each said oscillator of said plurality of oscillators provides a oscillator output in a different range of a desired band of oscillator frequencies.

* * * * *